(12) United States Patent
Nomura et al.

(10) Patent No.: US 11,076,484 B2
(45) Date of Patent: Jul. 27, 2021

(54) CIRCUIT MODULE

(71) Applicant: Murata Manufacturing Co., Ltd., Kyoto (JP)

(72) Inventors: Tadashi Nomura, Kyoto (JP); Masahiro Inoue, Kyoto (JP); Tetsuya Oda, Kyoto (JP); Hideki Shinkai, Kyoto (JP); Toru Koidesawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/860,131

(22) Filed: Apr. 28, 2020

(65) Prior Publication Data
US 2020/0260581 A1 Aug. 13, 2020

Related U.S. Application Data

(63) Continuation of application No. PCT/JP2018/040531, filed on Oct. 31, 2018.

(30) Foreign Application Priority Data

Nov. 2, 2017 (JP) .............................. JP2017-213149

(51) Int. Cl.
*H05K 1/18* (2006.01)
*H05K 1/11* (2006.01)
*H05K 1/14* (2006.01)

(52) U.S. Cl.
CPC ............. *H05K 1/115* (2013.01); *H05K 1/141* (2013.01); *H05K 1/185* (2013.01)

(58) Field of Classification Search
CPC ...... H05K 1/185; H05K 3/284; H05K 3/3436; H05K 1/115; H05K 1/141
(Continued)

(56) References Cited

U.S. PATENT DOCUMENTS 6,072,122 A * 6/2000 Hosoya ................... H01L 23/24
174/524
2005/0051358 A1* 3/2005 Kawamoto .......... H05K 3/3452
174/260

(Continued)

FOREIGN PATENT DOCUMENTS

JP  2004-103998 A  4/2004
JP  2006-313802 A  11/2006

(Continued)

OTHER PUBLICATIONS

International Search Report for International Application No. PCT/JP2018/040531, dated Jan. 5, 2019.

(Continued)

*Primary Examiner* — Sherman Ng
(74) *Attorney, Agent, or Firm* — Pearne & Gordon LLP

(57) ABSTRACT

A circuit module (100) includes a substrate (10) having a plurality of internal conductors (2), a first electronic component disposed on one principal surface (S1) of the substrate (10), a first resin layer (40) provided on the one principal surface (S1) and sealing the first electronic component, a plurality of outer electrodes (B1) provided on the other principal surface (S2) of the substrate (10) and including a ground electrode, a conductor film (50) at least provided on an outer surface of the first resin layer (40) and a side surface (S3) of the substrate (10) and connected to the ground electrode via at least one of the plurality of internal conductors (2), and a resin film (60).

6 Claims, 17 Drawing Sheets

(58) Field of Classification Search
USPC .......................................................... 174/260
See application file for complete search history.

(56) References Cited

U.S. PATENT DOCUMENTS

| | | | |
|---|---|---|---|
| 2006/0267159 A1* | 11/2006 | Yamamoto | H01L 23/3121 257/659 |
| 2010/0224396 A1* | 9/2010 | Nomiya | B32B 9/005 174/258 |
| 2013/0075143 A1 | 3/2013 | Kasajima et al. | |
| 2014/0204550 A1* | 7/2014 | Kataoka | H05K 1/0218 361/765 |
| 2018/0166394 A1 | 6/2018 | Otsubo et al. | |

FOREIGN PATENT DOCUMENTS

| | | |
|---|---|---|
| JP | 5951863 B2 | 7/2016 |
| JP | 2017-034224 A | 2/2017 |
| WO | 2017-026430 A1 | 2/2017 |

OTHER PUBLICATIONS

Written Opinion for International Application No. PCT/JP2018/040531, dated Jan. 15, 2019.

* cited by examiner

CIRCUIT MODULE

This is a continuation of International Application No. PCT/JP2018/040531 filed on Oct. 31, 2018 which claims priority from Japanese Patent Application No. 2017-213149 filed on Nov. 2, 2017. The contents of these applications are incorporated herein by reference in their entireties.

BACKGROUND OF THE DISCLOSURE

Field of the Disclosure

The present disclosure relates to a circuit module including a resin layer that is provided on one principal surface of a substrate and seals an electronic component, and a conductor film that is provided on an outer surface of the resin layer.

Description of the Related Art

A circuit module disclosed in Japanese Patent No. 5951863 (Patent Document 1) may be cited as an example of a circuit module including a resin layer that is provided on one principal surface of a substrate and seals an electronic component, and a conductor film that is provided on an outer surface of the resin layer. FIGS. 21A to 22C are cross-sectional views for explaining a manufacturing process of a circuit module 200 disclosed in Patent Document 1.

A base member 205 in an aggregate state and a substrate 210 are prepared, where the substrate 210 is attached to the base member 205 (FIG. 21A). At this stage, one principal surface of the substrate 210 is in contact with the base member 205. A groove T2 that is wider than a groove T1 to be described later and has a depth which does not cut the substrate 210 in an aggregate state, is formed on the other principal surface side of the substrate 210 (FIG. 21B). The substrate 210 is peeled off and detached from the base member 205 (FIG. 21C). The substrate 210 is attached to a base BL with an adhesive layer applied thereto (FIG. 21D). At this time, the substrate 210 is attached in such a manner that the one principal surface faces to an opposite side to a side of the base BL, and the other principal surface where the groove T2 is formed faces to the side of the base BL. An electronic component 220 is mounted on the one principal surface of the substrate 210 (FIG. 21E). A resin layer 240 is so formed as to seal the electronic component 220 on the one principal surface of the substrate 210 (FIG. 21F). The groove T1 is formed having a depth that cuts the substrate 210 in the aggregate state and the resin layer 240 from the resin layer 240 side, but does not cut the base BL (FIG. 22A).

Next, metallizing is performed on an upper surface of the resin layer 240 and an inner surface of the groove T1 by depositing metal fine particles thereon by sputtering, for example. Thus, a conductor film 250 is provided on the outer surface of the resin layer 240 and on the side surface of the substrate 210. The conductor film 250 is connected to a pattern conductor (not illustrated) connected to a ground electrode (not illustrated), at the side surface of the substrate 210 (FIG. 22B).

Then, the circuit module 200 in an aggregate state is singulated by being peeled off from the base BL, thereby each individual circuit module 200 being obtained as a finished product. At this time, the groove T2 becomes a recess C3 formed on the periphery of the other principal surface of the substrate 210 in the singulated circuit module 200 (FIG. 22C). The circuit module 200 includes a signal electrode (not illustrated) in addition to the ground electrode described above.

Patent Document 1: Japanese Patent No. 5951863

BRIEF SUMMARY OF THE DISCLOSURE

However, during the above-mentioned metallizing process, the metal fine particles generated by the sputtering also enter into the groove T2. Further, in a case where the substrate 210 in the aggregate state is warped or the substrate 210 in the aggregate state is attached being slanted with respect to the base BL, a gap is generated due to the warp or slant attachment of the substrate 210 so that the metal fine particles enter into such a gap as well. As a result, the signal electrode of the circuit module 200 and the conductor film 250 connected to the ground electrode are short-circuited, which arises a risk that the electric characteristics of the circuit module 200 become defective.

An object of the present disclosure is to provide a circuit module in which the occurrence of a short circuit is suppressed between a signal electrode and a conductor film that is provided on an outer surface of a resin layer sealing an electronic component and on a side surface of a substrate.

In a circuit module according to the present disclosure, the structure of a lower surface (a surface where an outer electrode is provided) of the circuit module is improved to suppress the occurrence of a short circuit between a signal electrode and a conductor film connected to a ground electrode.

A first aspect of a circuit module according to the present disclosure includes a substrate having a plurality of internal conductors; a first electronic component disposed on one principal surface of the substrate; a first resin layer provided on the one principal surface and sealing the first electronic component; a plurality of outer electrodes provided on the other principal surface of the substrate and including a ground electrode; a conductor film at least provided on an outer surface of the first resin layer and a side surface of the substrate, and connected to the ground electrode via at least one of the plurality of internal conductors; and a resin film. The resin film includes a first resin film provided on the other principal surface, and a second resin film having an annular shape and provided on the other principal surface in an outer side portion relative to the first resin film in a plane direction of the substrate. The plurality of outer electrodes are each disposed to be exposed from the first resin film. The second resin film is disposed being spaced from the first resin film.

A second aspect of a circuit module according to the present disclosure includes a substrate having a plurality of internal conductors; a first electronic component disposed on one principal surface of the substrate; a second electronic component disposed on the other principal surface of the substrate; a plurality of via conductors connected to the other principal surface of the substrate; a first resin layer provided on the one principal surface and sealing the first electronic component; a second resin layer provided on the other principal surface, and sealing the second electronic component and the plurality of via conductors; a plurality of outer electrodes provided in the second resin layer and including a ground electrode; a conductor film at least provided on an outer surface of the first resin layer, a side surface of the substrate and a side surface of the second resin layer, and connected to the ground electrode via at least one of the plurality of internal conductors and at least one of the plurality of via conductors; and a resin film. The resin film includes a first resin film provided in the second resin layer, and a second resin film having an annular shape and provided in the second resin layer in an outer side portion relative to the first resin film in a plane direction of the substrate. The plurality of outer electrodes are each disposed to be exposed from the first resin film. The second resin film is disposed being spaced from the first resin film.

A third aspect of a circuit module according to the present disclosure includes a substrate having a plurality of internal conductors; a first electronic component disposed on one principal surface of the substrate; a second electronic component disposed on the other principal surface of the substrate; a plurality of via conductors connected to the other principal surface of the substrate; a first resin layer provided on the one principal surface and sealing the first electronic component; a second resin layer provided on the other principal surface, and sealing the second electronic component and the plurality of via conductors; a plurality of outer electrodes provided in the second resin layer and including a ground electrode; and a conductor film at least provided on an outer surface of the first resin layer, a side surface of the substrate and a side surface of the second resin layer, and connected to the ground electrode via at least one of the plurality of internal conductors and at least one of the plurality of via conductors. The plurality of outer electrodes are disposed to be exposed from the second resin layer. On a surface of the second resin layer, there are formed a first projecting portion, and a second projecting portion provided being spaced from the first projecting portion in an outer side portion in a plane direction of the substrate.

In the circuit module according to the present disclosure, the occurrence of a short circuit is suppressed between a signal electrode and a conductor film that is provided on the outer surface of a resin layer sealing an electronic component and on the side surface of a substrate.

DETAILED DESCRIPTION OF THE DISCLOSURE

Figure 1:
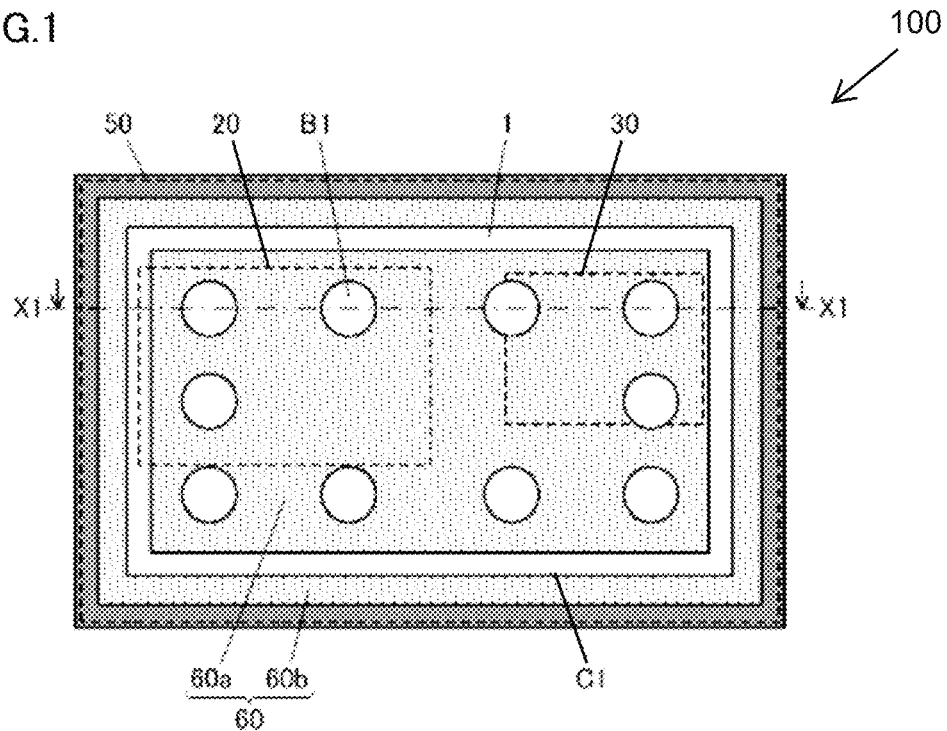
FIG. 1 is a plan view (bottom view) of a circuit module 100, which is a first embodiment of a circuit module according to the present disclosure.

Hereinafter, features of the present disclosure will be described in more detail by citing embodiments of the present disclosure. The present disclosure is applied to, for example, a circuit module used in an electronic apparatus that is required to have high reliability such as an on-vehicle apparatus, but the present disclosure is not limited thereto.

(First Embodiment of Circuit Module)

The structure and features of a circuit module 100, which is a first embodiment of a circuit module according to the present disclosure, will be described with reference to FIGS. 1 to 6B.

Note that each of the drawings is schematically illustrated. Further, variations in shapes or the like of the constituent elements generated during the manufacturing process, are not necessarily reflected in the drawings. In other words, it may be stated that the drawings used hereinafter for the description in this specification essentially represent actual products even if there is a portion different from the actual product.

Figure 2:
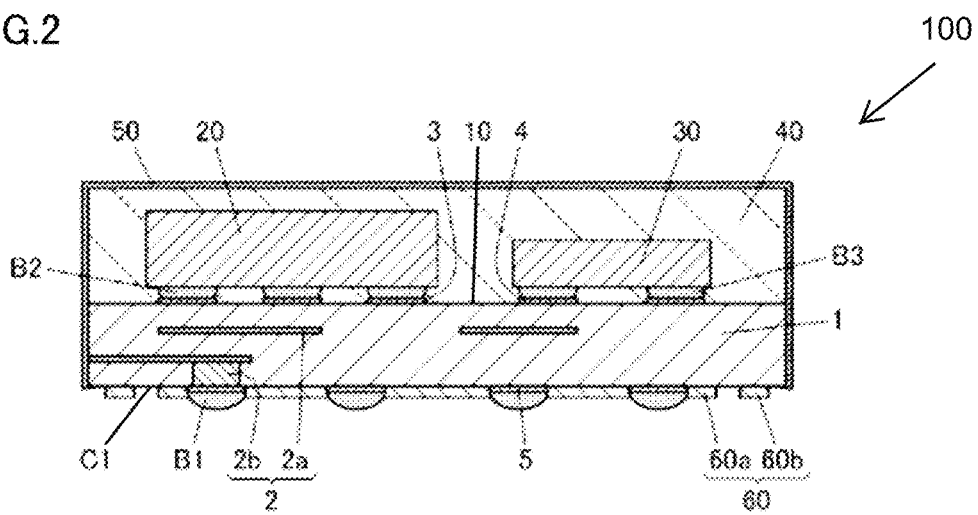
FIG. 2 is a cross-sectional view of the circuit module 100 taken by cutting along a plane including an X1-X1 line and seen from an arrow direction illustrated in FIG. 1.
Figure 3:
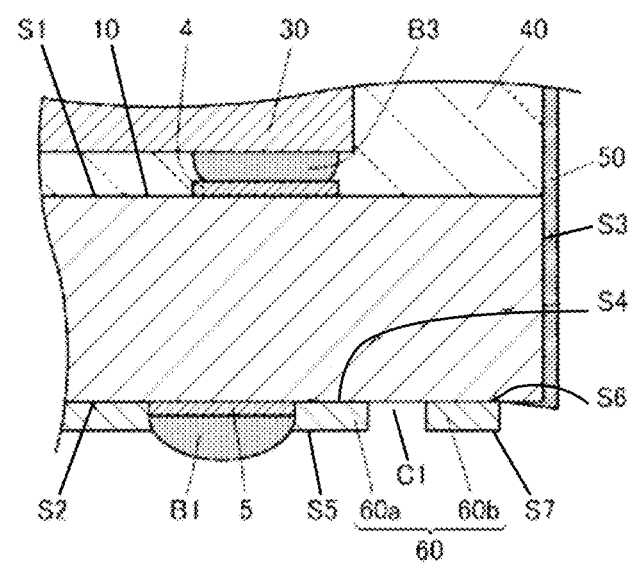
FIG. 3 is an enlarged cross-sectional view of the circuit module 100 illustrated in FIG. 2.

FIG. 1 is a plan view (bottom view) of the circuit module 100. FIG. 2 is a cross-sectional view of the circuit module 100 taken by cutting along a plane including an X1-X1 line and seen from an arrow direction illustrated in FIG. 1. FIG. 3 is a cross-sectional view in which a major portion of the cross-sectional view seen from the arrow direction of the circuit module 100 illustrated in FIG. 2 is enlarged and depicted. Although FIG. 1 is not a cross-sectional view, some of the constituent members are illustrated as being shaded, in order to facilitate the understanding of the constituent members.

The circuit module 100 includes a substrate 10, first electronic components 20 and 30, a first resin layer 40, a plurality of outer electrodes B1, a conductor film 50, and a resin film 60. The substrate 10 includes one principal surface S1, the other principal surface S2, and a side surface S3 connecting the one principal surface S1 and the other principal surface S2 (see FIG. 3).

The substrate 10 is provided with an insulator layer 1 and a plurality of internal conductors 2 formed therein. The internal conductor 2 includes a pattern conductor 2a and a via conductor 2b. A material selected from, for example, a low-temperature fired ceramic material and a composite material of glass fibers and epoxy resin, and the like, is used for the insulator layer 1. A metal material such as Cu is used for the internal conductor 2. Lands 3 and 4 are provided on the one principal surface S1 of the substrate 10. A land 5 is provided on the other principal surface S2.

The first electronic components 20 and 30 are various types of electronic components such as integrated circuits, laminated capacitors, laminated inductors, and the like. The first electronic component 20 is connected to the land 3 with a connection member B2 such as Pb-free solder. The first electronic component 30 is connected to the land 4 with a connection member B3 similar to the connection member B2. In other words, the first electronic components 20 and 30 are connected to the one principal surface S1 side of the substrate 10.

The first resin layer 40 is provided on the one principal surface S1 to seal the first electronic components 20 and 30. For the first resin layer 40, a resin material in which a glass material, silica, or the like is dispersed as a filler is used. However, the filler may not be contained.

The plurality of outer electrodes B1 include a signal electrode and a ground electrode. For example, solder bumps containing Pb-free solder are used for the plurality of outer electrodes B1. In the circuit module 100, the plurality of outer electrodes B1 are each provided on the land 5. Note that, however, the outer electrode B1 may be provided directly on the via conductor 2b exposed on the other principal surface S2. In other words, the plurality of outer electrodes B1 are provided on the other principal surface S2 side.

The conductor film 50 is provided on an outer surface of the first resin layer 40, on the side surface S3, and on the vicinity of the outer circumference of the other principal surface S2, and is connected to the ground electrode via at least one of the plurality of internal conductors 2. A metal material such as Cu is used for the conductor film 50. In the conductor film 50, a plurality of layers of different types of metal films may be laminated. The approach to forming the conductor film 50 will be described later.

The resin film 60 includes a first resin film 60a, and a second resin film 60b having an annular shape; the first and second resin films 60a and 60b are provided on the other principal surface S2 of the substrate 10. The first resin film 60a has a surface S4 in contact with the other principal surface S2 and a surface S5 opposing the surface S4. The annular-shaped second resin film 60b has a surface S6 in contact with the other principal surface S2 and a surface S7 opposing the surface S6 (see FIG. 3). For example, a resin material such as an epoxy resin is used for the resin film 60.

The plurality of outer electrodes B1 are each disposed on the inner side relative to the outer circumference of the surface S5 of the first resin film 60a and to be exposed from the surface S5 in a plan view (a plan view seen from the lower side of the circuit module 100) in the normal direction of the other principal surface S2 of the substrate 10 (see FIG. 1). The annular-shaped second resin film 60b is disposed on the inner side relative to the outer circumference of the other principal surface S2 of the substrate 10 while being spaced from the side surface S3.

The first resin film 60a and the annular-shaped second resin film 60b are arranged so that a first gap C1 exists between the outer circumference of the surface S5 of the first resin film 60a and the inner circumference of the surface S7 of the second resin film 60b (see FIG. 3).

Figure 4A:
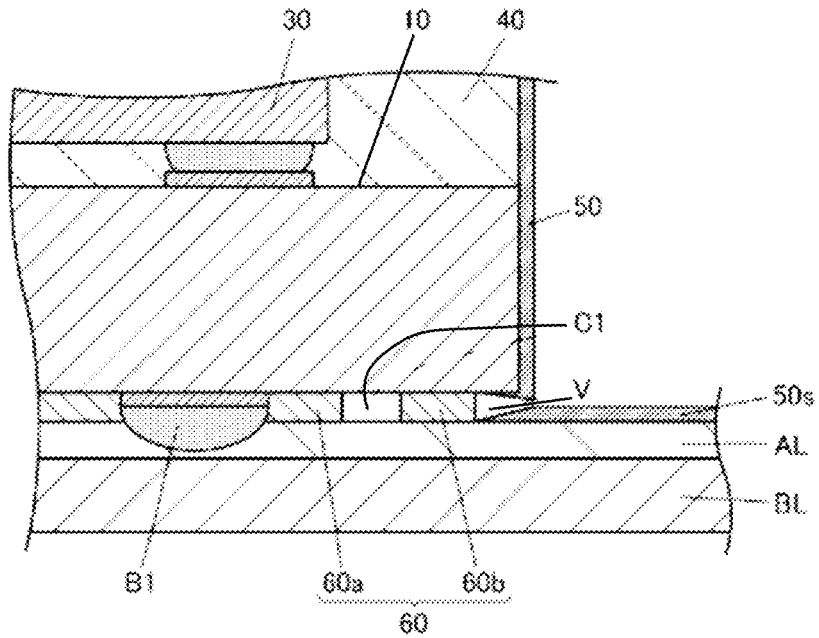
FIGS. 4A and 4B include enlarged cross-sectional views for explaining a process of applying a conductor film 50 to a semifinished product in a manufacturing process of the circuit module 100.
Figure 4B:
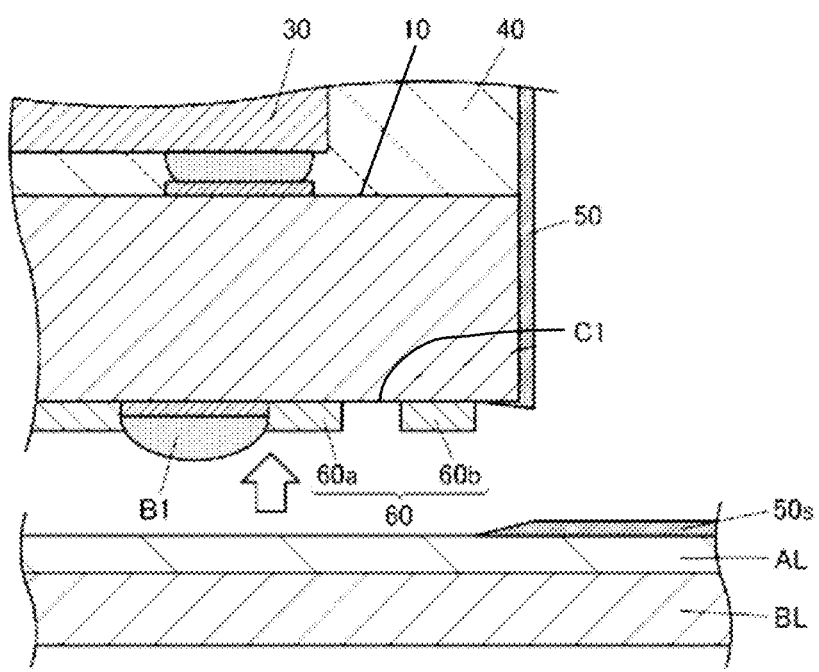

Here, the formation of the conductor film 50 in the manufacturing process of the circuit module 100 will be described with reference to FIGS. 4A to 6B. FIGS. 4A and 4B include enlarged cross-sectional views for explaining a process of applying the conductor film 50 to a semifinished product in the manufacturing process of the circuit module 100. Other processes such as a process of connecting the first electronic components 20 and 30 to the substrate 10 and a process of applying the resin film 60 (the first resin film 60a and second resin film 60b) to the substrate 10 are not described.

FIG. 4A illustrates a process in which the conductor film 50 is applied onto the outer surface of the first resin layer 40 and the side surface S3 of the substrate 10 of the semifinished product in a state where the substrate 10 is not slanted with respect to the base BL. The semifinished product of the circuit module 100 without the conductor film 50 being applied is attached to the base BL with an adhesive layer AL being applied thereto. The outer electrode B1 sinks into the adhesive layer AL, and the surface S5 of the first resin film 60a and the surface S7 of the second resin film 60b are in contact with the adhesive layer AL (see FIG. 3).

At this time, an annular-shaped space V is formed whose inner wall surface includes the other principal surface S2 of the substrate 10 (see FIG. 3), the outer circumference surface of the annular-shaped second resin film 60b, and the outer surface of the adhesive layer AL. As described above, there exists the first gap C1 between the outer circumference of the surface S5 of the first resin film 60a and the inner circumference of the surface S7 of the second resin film 60b.

Subsequently, metallizing is performed on the outer surface of the first resin layer 40 and on the side surface S3 by depositing metal fine particles by sputtering, for example. Thus, the conductor film 50 is provided on the outer surface of the first resin layer 40 and on the side surface S3. At this time, the conductor film 50 is so formed as to extend also onto the vicinity of a connecting portion of the other principal surface S2 with the side surface S3. The metal fine particles generated by sputtering are also deposited on the outer surface of the adhesive layer AL to form an excess conductor film 50s.

This excess conductor film 50s also enters into the annular-shaped space V. Note that, however, since the surface S7 of the annular-shaped second resin film 60b is in contact with the adhesive layer AL, the excess conductor film 50s will not climb over the second resin film 60b from the annular-shaped space V to enter the first gap C1.

FIG. 4B illustrates a process in which, after the formation of the conductor film 50, the circuit module 100 is peeled off from the base BL with the adhesive layer AL being applied thereto. The circuit module 100 is generally manufactured in an aggregate state while being attached to the base BL. Then, the circuit module 100 in the aggregate state is singulated by being peeled off from the base BL, whereby each individual circuit module 100 is obtained as a finished product illustrated in FIG. 2, for example.

On the other hand, FIGS. 5A to 6B illustrate a process in which the conductor film 50 is applied onto the outer surface of the first resin layer 40 and the side surface S3 of the substrate 10 of a semifinished product in a state where the substrate 10 is slanted with respect to the base BL. The same constituent elements as those illustrated in FIGS. 4A and 4B are denoted by the same reference signs. When the semifinished product of the circuit module 100 is attached to the adhesive layer AL, in the case where the substrate 10 is slanted with respect to the base BL, there is a risk that a gap is formed between the resin film and the outer surface of the adhesive layer AL.

Figure 5A:
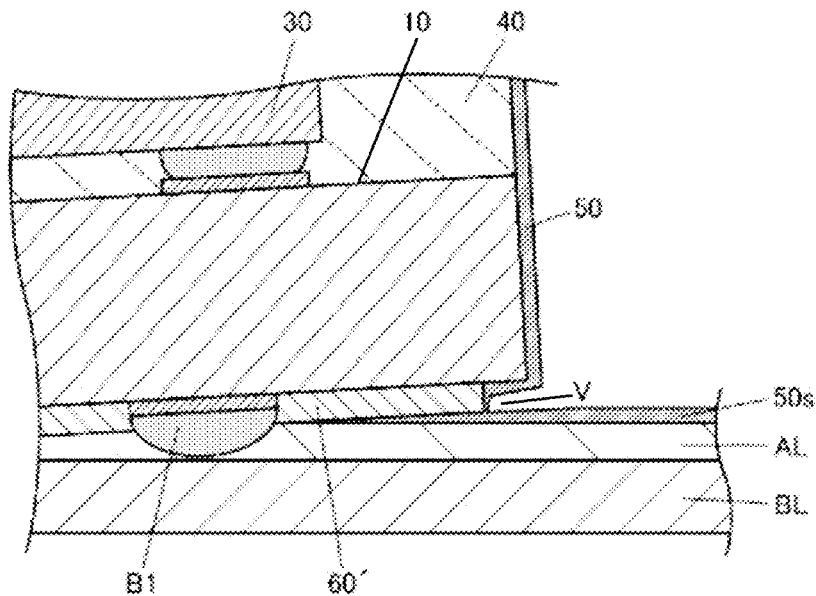
FIGS. 5A and 5B include enlarged cross-sectional views for explaining a process of applying the conductor film 50 to a semifinished product in a state where a substrate 10 is slanted with respect to a base BL, in a manufacturing process of a circuit module in which a first gap C1 is not provided.

FIG. 5A illustrates a process in which the conductor film 50 is applied to a semifinished product in a manufacturing process of a circuit module to which applied is a resin film 60' without being provided with the first gap C1 on the other principal surface S2 of the substrate 10. The metal fine particles generated by sputtering pass through the annular-shaped space V and the gap, and reach the outer electrode B1. As a result, the outer electrode B1 is connected to the conductor film 50 with part of the excess conductor film 50s.

Figure 5B:
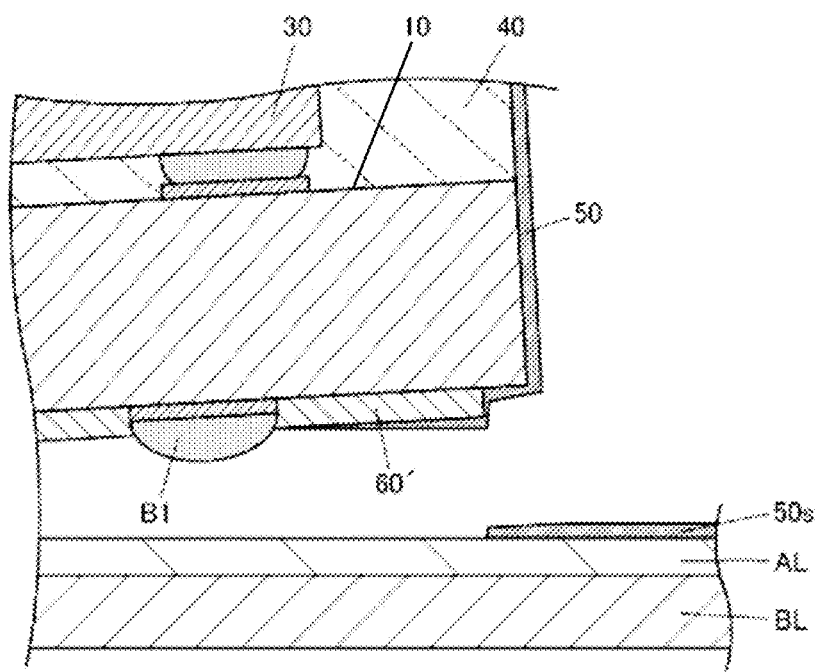

FIG. 5B illustrates a process in which, after the formation of the conductor film 50, the circuit module is peeled off from the base BL with the adhesive layer AL being applied thereto. In this peeling process, as illustrated in FIG. 5B, part of the excess conductor film 50s is attached to the resin film 60' side, which arises a risk that the outer electrode B1 and the conductor film 50 remain being connected to each other.

When the outer electrode B1 connected to the conductor film 50 with part of the excess conductor film 50s is a ground electrode, there arises no problem with respect to electric characteristics. On the other hand, when the above-mentioned outer electrode B1 is a signal electrode, since the conductor film 50 and the signal electrode are short-circuited, there arises a risk that the electric characteristics of the circuit module are deteriorated to be defective.

Figure 6A:
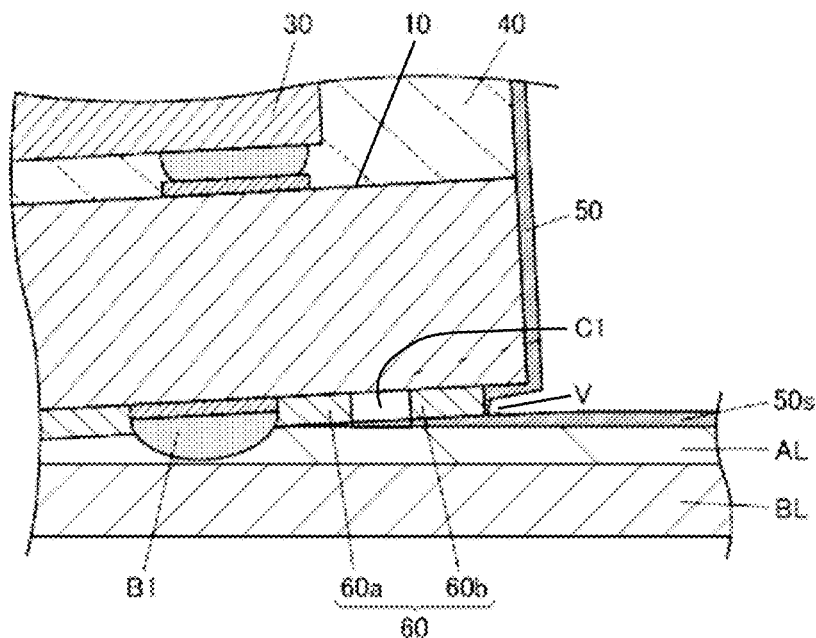
FIGS. 6A and 6B include enlarged cross-sectional views for explaining a process of applying the conductor film 50 to a semifinished product in a state where the substrate 10 is slanted with respect to the base BL, in a manufacturing process of the circuit module 100 in which the first gap C1 is provided.

FIG. 6A illustrates a process of applying the conductor film 50 to a semifinished product in the manufacturing process of the circuit module 100, in which the first gap C1 is provided on the other principal surface S2 of the substrate 10. As with the case where the first gap C1 is not present as illustrated in FIG. 5A, the metal fine particles generated by sputtering pass through the annular-shaped space V and the gap, and reach the outer electrode B1. At this time, the outer electrode B1 is connected to the conductor film 50 with part of the excess conductor film 50s.

However, the excess conductor film 50s is not in contact with the resin film 60 in the first gap C1. In other words, the excess conductor film 50s is not applied to an inner wall (a surface connecting the surfaces S4 and S5, the other principal surface S2, and a surface connecting the surfaces S6 and S7) of the first gap C1 (see FIG. 3).

Figure 6B:
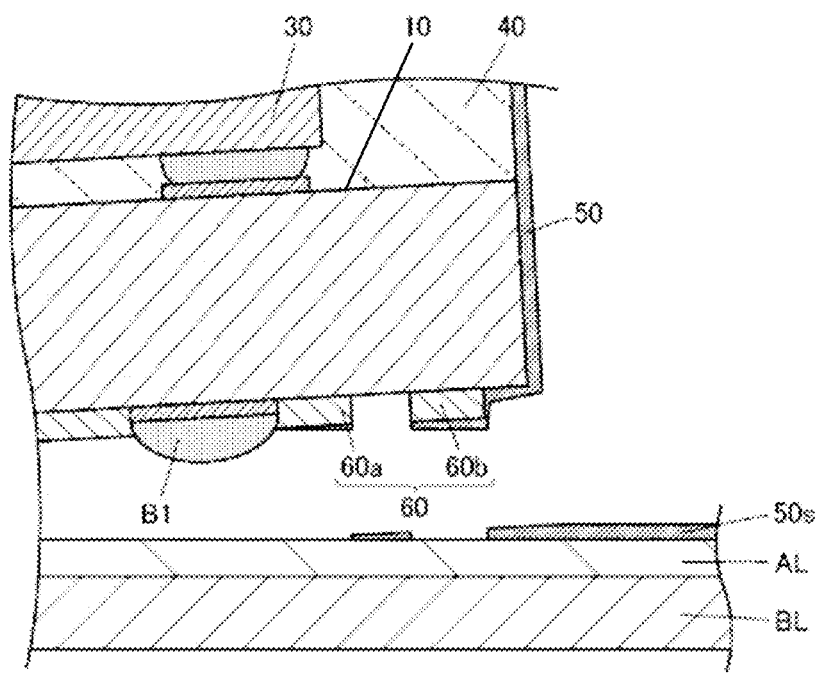

FIG. 6B illustrates a process in which, after the formation of the conductor film 50, the circuit module 100 is peeled off from the base BL with the adhesive layer AL being applied thereto. In this peeling process, as illustrated in FIG. 6B, part of the excess conductor film 50s is attached to the adhesive layer AL side. As described above, the excess conductor film 50s is not applied to the inner wall of the first gap C1. Accordingly, after the circuit module 100 having been peeled off from the base BL, the connection between the outer electrode B1 and the conductor film 50 with the excess conductor film 50s is prevented.

In other words, in the circuit module 100, the occurrence of a short circuit is suppressed between the signal electrode and the conductor film 50 provided on the outer surface of the first resin layer 40, the side surface S3 of the substrate 10, and the vicinity of the outer circumference of the other principal surface S2.

<<Modification Examples of First Embodiment of Circuit Module>>

Various modification examples of the circuit module 100, which is the first embodiment of the circuit module according to the present disclosure, will be described with reference to FIGS. 7A to 12. Regarding the constituent elements of each modification example, the description of the same constituent elements as those in the circuit module 100 may be omitted or simplified.

<<First to Third Modification Examples>>

Figure 7A:
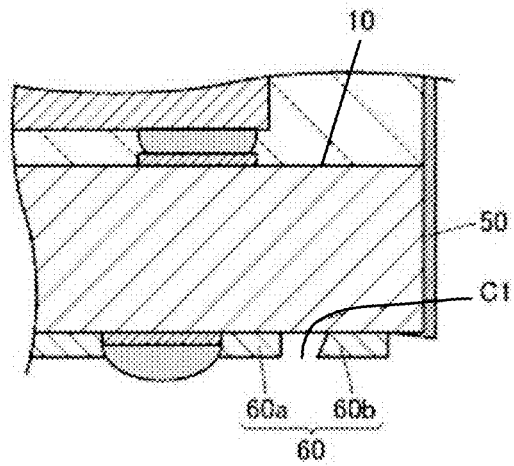
FIGS. 7A, 7B and 7C include enlarged cross-sectional views for explaining first to third modification examples of the circuit module 100.

First to third modification examples of the circuit module 100 will be described with reference to FIGS. 7A, 7B and 7C. FIG. 7A is an enlarged cross-sectional view, equivalent to the drawing in FIG. 3, for explaining the first modification example of the circuit module 100. In the first modification example illustrated in FIG. 7A, the inner circumference of the surface S7 of the second resin film 60b is located on the inner side relative to the inner circumference of the surface S6 thereof. That is, an annular-shaped surface connecting the inner circumference of the surface S7 and the inner circumference of the surface S6 has a tapered shape in which the inner circumference becomes smaller as a distance from the other principal surface S2 of the substrate is increased.

In this case, the metal fine particles generated by sputtering are unlikely to spread particularly onto the surface, which is included in the inner wall of the first gap C1, connecting the surfaces S6 and S7. Accordingly, the excess conductor film 50s is unlikely to be applied to the surface connecting the surfaces S6 and S7. As a result, the occurrence of a short circuit is further suppressed between the conductor film 50 and the signal electrode.

Figure 7B:
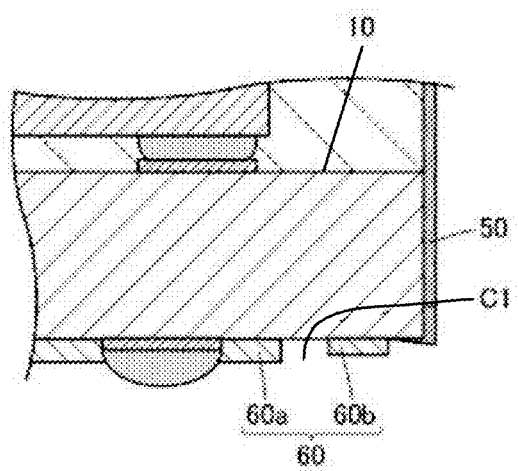

FIG. 7B is an enlarged cross-sectional view, equivalent to the drawing in FIG. 3, for explaining the second modification example of the circuit module 100. In the second modification example illustrated in FIG. 7B, the height of the surface S7 of the second resin film 60b from the other principal surface S2 of the substrate 10 is lower than the height of the surface S5 of the first resin film 60a therefrom.

Figure 7C:
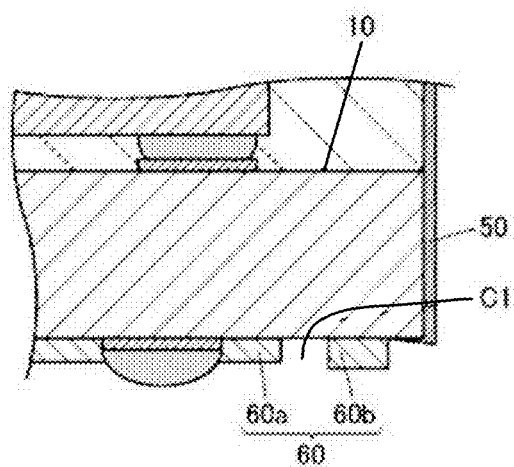

FIG. 7C is an enlarged cross-sectional view, equivalent to the drawing in FIG. 3, for explaining the third modification example of the circuit module 100. In the third modification example illustrated in FIG. 7C, the height of the surface S7 of the second resin film 60b from the other principal surface S2 of the substrate 10 is higher than the height of the surface S5 of the first resin film 60a therefrom. That is, the surface S7 of the second resin film 60b is not necessarily flush with the surface S5 of the first resin film 60a.

In particular, in the third modification example, even when the substrate 10 is slanted with respect to the base BL, a gap is hardly formed between the second resin film 60b and the outer surface of the adhesive layer AL. Further, the excess conductor film 50s is unlikely to be applied to the inner wall of the first gap C1. As a result, the occurrence of a short circuit is further suppressed between the conductor film 50 and the signal electrode.

<Fourth Modification Example>

Figure 8:
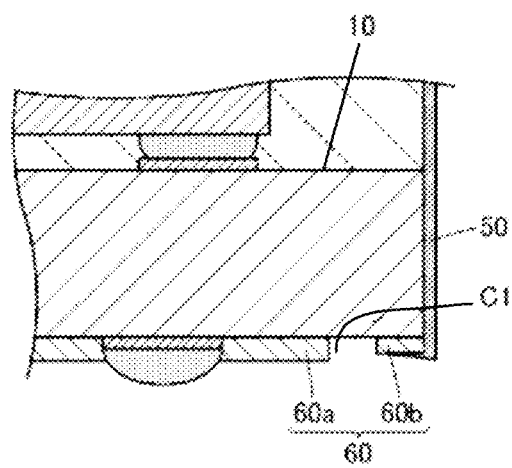
FIG. 8 is an enlarged cross-sectional view for explaining a fourth modification example of the circuit module 100.

A fourth modification example of the circuit module 100 will be described with reference to FIG. 8. FIG. 8 is an enlarged cross-sectional view, equivalent to the drawing in FIG. 3, for explaining the fourth modification example of the circuit module 100. In the fourth modification example illustrated in FIG. 8, the annular-shaped second resin film 60b is so disposed as to be in contact with the inner circumference of the other principal surface S2 of the substrate 10. That is, the second resin film 60b is not necessarily disposed being spaced apart from the side surface S3 on the inner side relative to the inner circumference of the other principal surface S2 of the substrate 10.

In the fourth modification example illustrated in FIG. 8, the height of the surface S7 of the second resin film 60b from the other principal surface S2 of the substrate 10 is lower than the height of the surface S5 of the first resin film 60a therefrom. In this case, after the formation of the conductor film 50, when the circuit module 100 is peeled off from the base BL with the adhesive layer AL being applied thereto, a situation in which the excess conductor film 50s adheres to the circuit module 100 (so-called burr generation) is suppressed.

<Fifth and Sixth Modification Examples>

Figure 9A:
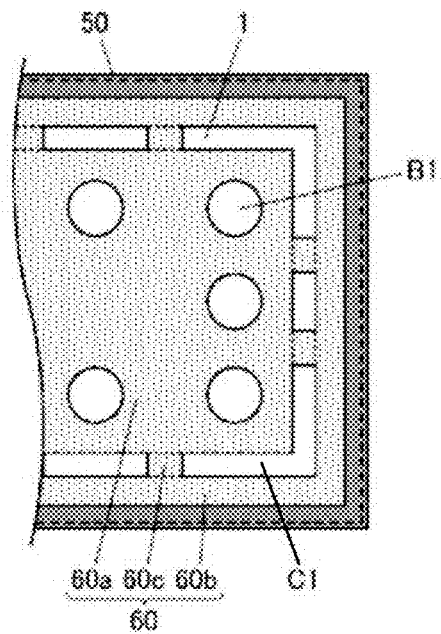
FIGS. 9A and 9B include plan views (bottom views) for explaining fifth and sixth modification examples of the circuit module 100.

Fifth and sixth modification examples of the circuit module 100 will be described with reference to FIGS. 9A and 9B. FIG. 9A is a plan view (bottom view), equivalent to the drawing in FIG. 1, for explaining the fifth modification example of the circuit module 100. In the fifth modification example illustrated in FIG. 9A, the resin film 60 further includes a third resin film 60c having a belt shape, in addition to the first resin film 60a and the annular-shaped second resin film 60b. The first resin film 60a and the annular-shaped second resin film 60b are partially connected to each other with the belt-shaped third resin film 60c.

The thickness of the third resin film 60c is the same as that of the first resin film 60a and the second resin film 60b. However, the third resin film 60c is not disposed between the outer electrode B1 and the conductor film 50.

In this case, the first resin film 60a having a large contact area with the other principal surface S2 of the substrate 10 and the annular-shaped second resin film 60b having a small contact area with the other principal surface S2 are connected to each other with the belt-shaped third resin film 60c. Accordingly, a situation in which the second resin film 60b is peeled off from the other principal surface S2 is suppressed. As a result, the roundabout spread of the metal fine particles during sputtering is effectively prevented.

Figure 9B:
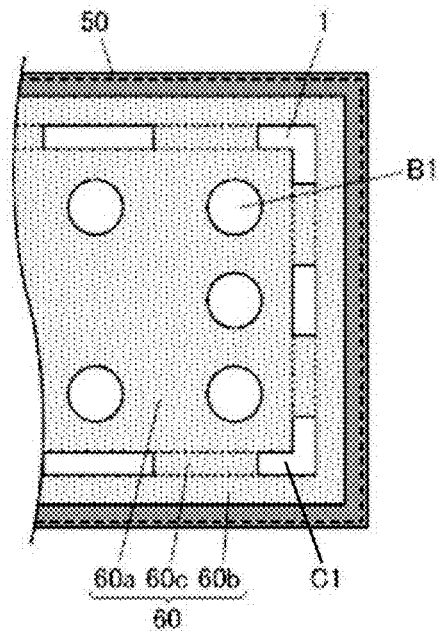

FIG. 9B is a plan view (bottom view), equivalent to the drawing in FIG. 1, for explaining the sixth modification example of the circuit module 100. Also, in the sixth modification example illustrated in FIG. 9B, the first resin film 60a and the second resin film 60b are partially connected to each other with the belt-shaped third resin film 60c. The thickness of the third resin film 60c is the same as that of the first resin film 60a and the second resin film 60b.

Note that in the sixth modification example, the outer electrode B1 disposed in the vicinity of a corner of the first resin film 60a having a rectangular shape is a ground electrode. In the case where the outer electrode B1 is a ground electrode, there arises no problem even when it is brought into contact with the conductor film 50. Accordingly, in the sixth modification example, the third resin film 60c having a width wider than that of the fifth modification example is disposed between the outer electrode B1 and the conductor film 50.

In this case, the situation in which the second resin film 60b is peeled off from the other principal surface S2 is further suppressed. As a result, the roundabout spread of the metal fine particles during sputtering is further effectively prevented.

<Seventh to Ninth Modification Examples>

Figure 10A:
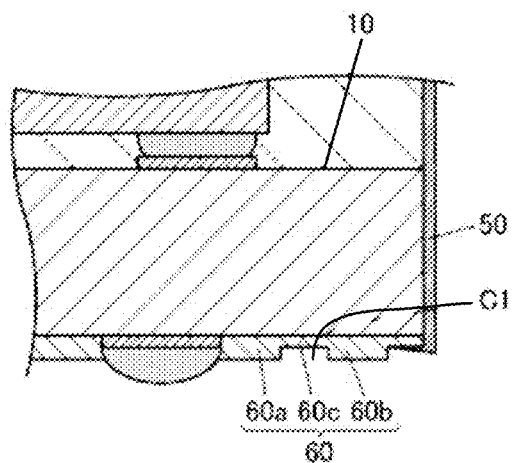
FIGS. 10A, 10B and 10C include enlarged cross-sectional views for explaining seventh to ninth modification examples of the circuit module 100.

The seventh to ninth modification examples of the circuit module 100 will be described with reference to FIGS. 10A, 10B and 10C. FIG. 10A is an enlarged cross-sectional view, equivalent to the drawing in FIG. 3, for explaining the seventh modification example of the circuit module 100. In the seventh modification example illustrated in FIG. 10A, the resin film 60 further includes a third resin film 60c having an annular shape, in addition to the first resin film 60a and the annular-shaped second resin film 60b. The first resin film 60a and the annular-shaped second resin film 60b are connected to each other with the annular-shaped third resin film 60c.

The first resin film 60a, the annular-shaped second resin film 60b, and the annular-shaped third resin film 60c are provided on the same plane, that is, on the other principal surface S2 of the substrate 10. The thickness of the third resin film 60c is thinner than the thickness of the first resin film 60a and the thickness of the second resin film 60b. Accordingly, as described in the first embodiment, the first gap C1 exists between the outer circumference of the surface S5 and the inner circumference of the surface S7.

In the seventh modification example, an annular-shaped resin film is also provided between the annular-shaped second resin film 60b and the inner circumference of the other principal surface S2 of the substrate 10, but this resin film is not absolutely needed.

Figure 10B:
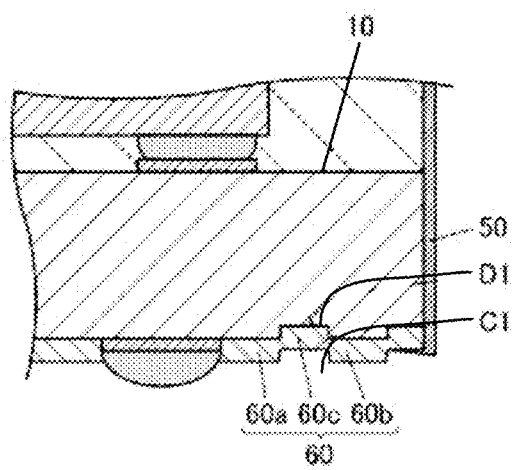
Figure 10C:
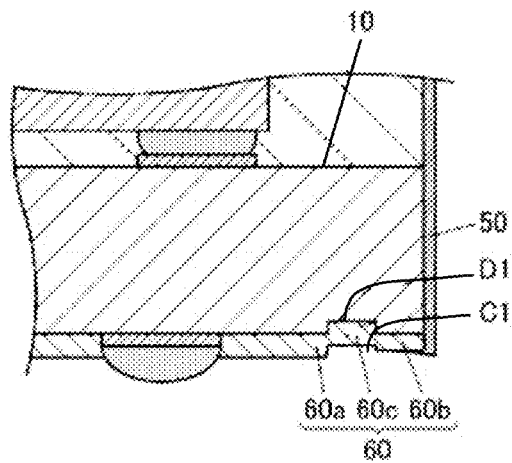

FIG. 10B is an enlarged cross-sectional view, equivalent to the drawing in FIG. 3, for explaining the eighth modification example of the circuit module 100. In the eighth modification example illustrated in FIG. 10B, the other principal surface S2 of the substrate 10 includes a recess D1 having an annular shape. The annular-shaped third resin film 60c described in the seventh modification example enters into the annular-shaped recess D1. Also, in this case, the first gap C1 exists between the outer circumference of the surface S5 and the inner circumference of the surface S7.

It is sufficient that the third resin film 60c has a thickness that makes it possible to form the first gap C1 in a state where the third resin film 60c enters into the recess D1. In other words, it is not necessary for the thickness of the third resin film 60c to be thinner than each of the thickness of the first resin film 60a and the thickness of the second resin film 60b.

In the eighth modification example, an annular-shaped recess is also provided between the annular-shaped second resin film 60b and the inner circumference of the other principal surface S2 of the substrate 10, and the annular-shaped resin film enters into this recess. However, as in the ninth modification example of the circuit module 100 illustrated in an enlarged cross-sectional view of FIG. 10C, the annular-shaped second resin film 60b may be so disposed as to be in contact with the inner circumference of the other principal surface S2 of the substrate 10. That is, the configuration described above is not essential.

In the seventh to ninth modification examples, the first resin film 60a having a large contact area with the other principal surface S2 of the substrate 10 and the annular-shaped second resin film 60b having a small contact area with the other principal surface S2 thereof are connected to each other with the annular-shaped third resin film 60c. Therefore, the situation in which the second resin film 60b is peeled off from the other principal surface S2 is more suppressed than in the case where the third resin film 60c is belt-shaped. As a result, the roundabout spread of the metal fine particles during sputtering is prevented more effectively than in the case where the third resin film 60c is belt-shaped.

<Tenth Modification Example>

Figure 11:
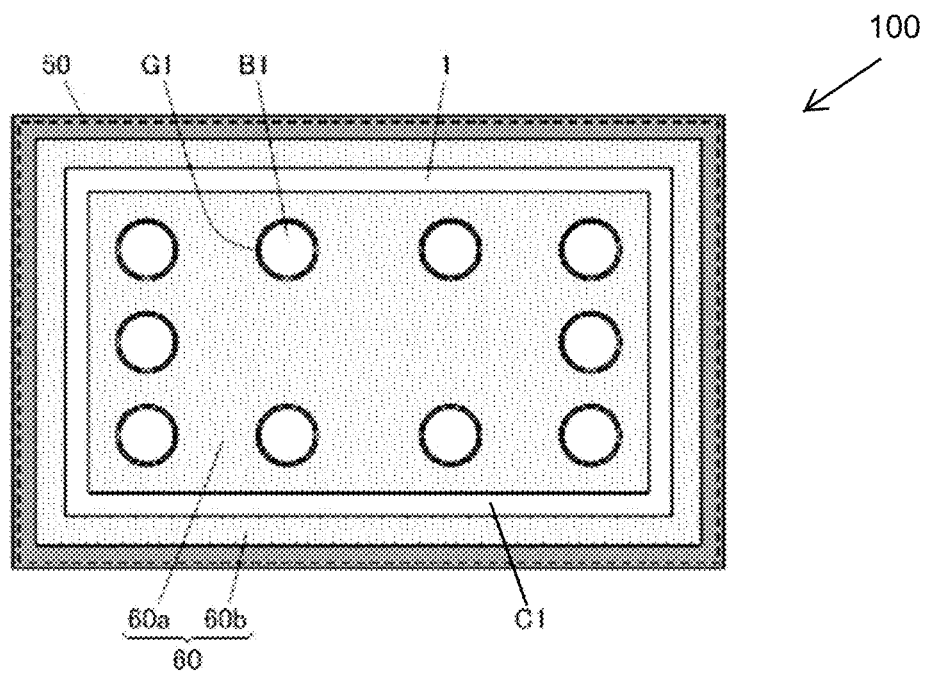
FIG. 11 is a plan view (bottom view) for explaining a tenth modification example of the circuit module 100.
Figure 12:
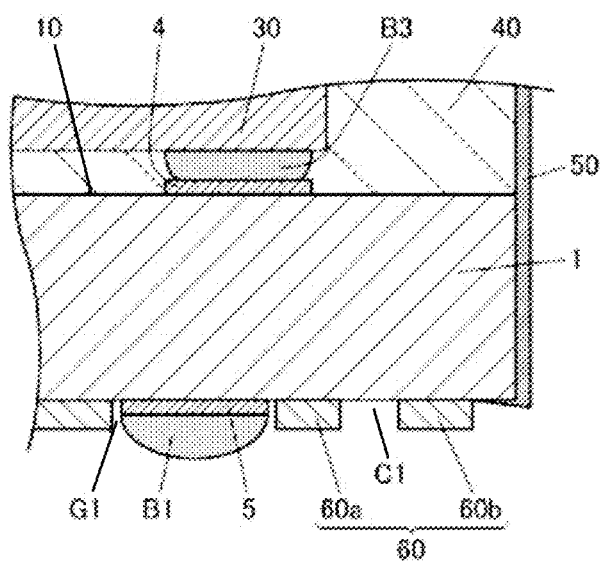
FIG. 12 is an enlarged cross-sectional view for explaining the tenth modification example of the circuit module 100.

A tenth modification example of the circuit module 100 will be described with reference to FIGS. 11 and 12. FIG. 11 is a plan view (bottom view), equivalent to the drawing in FIG. 1, for explaining the tenth modification example of the circuit module 100. FIG. 12 is an enlarged cross-sectional view of the tenth modification example equivalent to the drawing in FIG. 3. In the tenth modification example illustrated in FIGS. 11 and 12, a gap G1 having an annular shape is provided around the outer electrode B1 in addition to the above-described configuration of the circuit module 100.

In this case, the above-described excess conductor film 50s is not applied to the inner wall of the gap G1. That is, the first gap C1 and the gap G1 doubly prevent the roundabout spread of the metal fine particles during the sputtering. As a result, the occurrence of a short circuit is further suppressed between the conductor film 50 and the signal electrode.

(Second Embodiment of Circuit Module)

The structure and features of a circuit module 100A, which is a second embodiment of a circuit module according to the present disclosure, will be described with reference to FIGS. 13 to 15. Regarding the constituent elements of the circuit module 100A, the description of the same constituent elements as those in the circuit module 100 may be omitted or simplified.

Figure 13:
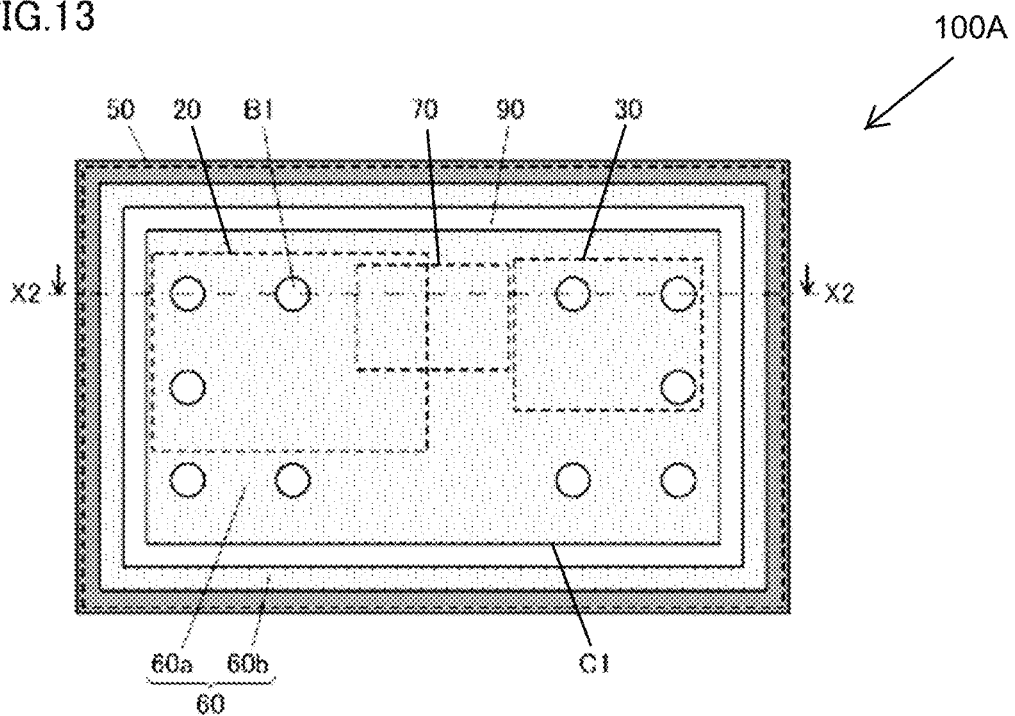
FIG. 13 is a plan view (bottom view) of a circuit module 100A, which is a second embodiment of a circuit module according to the present disclosure.
Figure 14:
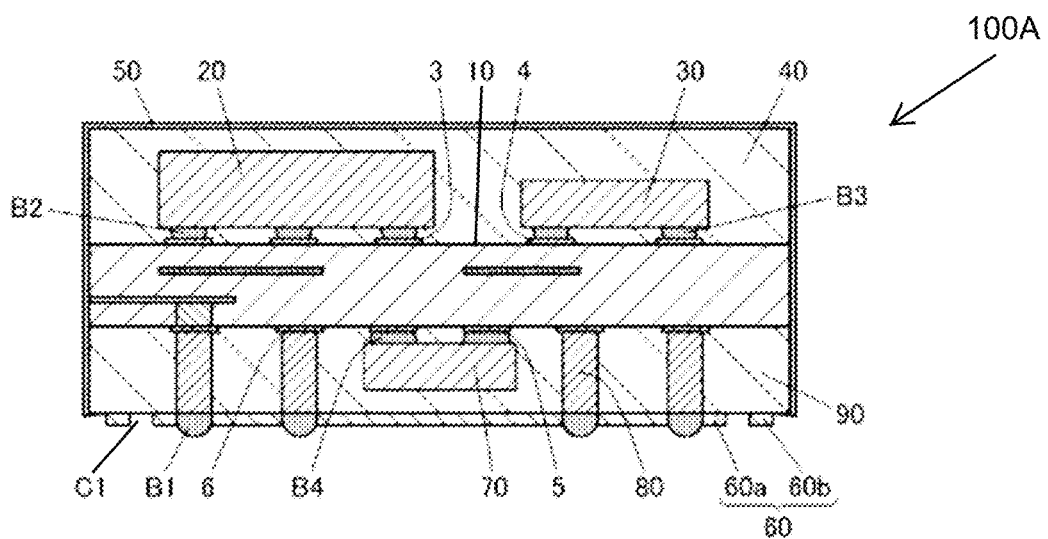
FIG. 14 is a cross-sectional view, equivalent to the drawing in FIG. 2, of the circuit module 100A, which is the second embodiment of the circuit module according to the present disclosure.

FIG. 13 is a plan view (bottom view) of the circuit module 100A. FIG. 14 is a cross-sectional view of the circuit module 100A taken by cutting along a plane including an X2-X2 line and seen from an arrow direction illustrated in FIG. 13. FIG. 15 is a cross-sectional view in which a major portion of the cross-sectional view seen from the arrow direction of the circuit module 100A illustrated in FIG. 14 is enlarged and depicted. Although FIG. 13 is not a cross-sectional view, some of the constituent members are illustrated as being shaded, in order to facilitate the understanding of the constituent members.

The circuit module 100A includes a second electronic component 70, a plurality of via conductors 80, and a second resin layer 90, in addition to the configuration of the circuit module 100. The second electronic component 70 refers to a variety of electronic components similar to the first electronic components 20 and 30. The second electronic component 70 is connected to a land 5 with a connection member B4 such as Pb-free solder.

An end surface on a surface S6 side of each of the plurality of via conductors 80 is connected to a land 6. The via conductor 80 may be directly formed on the land 6, or the previously-formed via conductor 80 may be connected to the land 6 with a connection member. That is, the second electronic component 70 and the plurality of via conductors 80 are connected to the other principal surface S2 side of the substrate 10.

The second resin layer 90 is provided on the other principal surface S2 to seal the second electronic component 70 and the plurality of via conductors 80. The second resin layer 90 includes a surface S8 in contact with the other principal surface S2, a surface S9 opposing the surface S8, and a surface S10 connecting the surfaces S8 and S9. For the second resin layer 90 as well, a resin material in which a glass material, silica, or the like is dispersed as a filler is used. However, the filler may not be contained. Different kinds of resin materials may be used for the first resin layer 40 and the second resin layer 90, respectively.

A plurality of outer electrodes B1 include a signal electrode and a ground electrode. As in the circuit module 100, solder bumps containing Pb-free solder, for example, are used for the plurality of outer electrodes B1. Note that in the circuit module 100A, the outer electrode B1 is provided on an end surface on the surface S9 side of each of the plurality of via conductors 80. The outer electrode B1 may be provided on the end surface on the surface S9 side of the via conductor 80 via an intermediate film formed by plating or the like.

The conductor film 50 is provided on the outer surface of the first resin layer 40, on the side surface S3, on the surface S10, and on the vicinity of the outer circumference of the surface S9. The conductor film 50 is connected to the ground electrode via at least one of the plurality of internal conductors in the substrate 10 and at least one of the plurality of via conductors 80. A metal material such as Cu is used for the conductor film 50.

A resin film 60 includes a first resin film 60a and a second resin film 60b having an annular shape; the first and second resin films 60a and 60b are provided on the surface S9 of the second resin layer 90. The first resin film 60a has a surface S4 in contact with the surface S9 and a surface S5 opposing the surface S4. The annular-shaped second resin film 60b has a surface S6 in contact with the surface S9 and a surface S7 opposing the surface S6. A resin material such as an epoxy resin is used for the resin film 60 (see FIG. 15).

The plurality of outer electrodes B1 are each disposed on the inner side relative to the outer circumference of the surface S5 of the first resin film 60a and to be exposed from the surface S5 in a plan view (a plan view seen from the lower side of the circuit module 100A) in the normal direction of the surface S9 of the second resin layer 90 (see FIG. 13). The annular-shaped second resin film 60b is disposed on the inner side relative to the outer circumference of the surface S9 of the second resin layer 90 while being spaced away from the surface S10.

Figure 15:
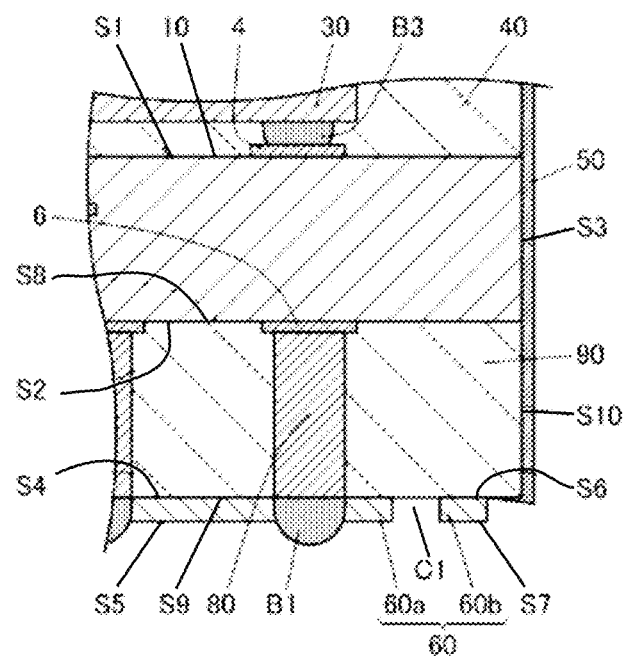
FIG. 15 is an enlarged cross-sectional view of a cross-sectional view of the circuit module 100A seen from an arrow direction illustrated in FIG. 13.

The first resin film 60a and the second resin film 60b are arranged so that a first gap C1 exists between the outer circumference of the surface S5 of the first resin film 60a and the inner circumference of the surface S7 of the second resin film 60b (see FIG. 15).

Also, in the circuit module 100A, there may be a case where the second resin layer 90 is slanted with respect to the base BL in the manufacturing process. Even in such a case, the excess conductor film 50s discussed above is not applied to an inner wall (a surface connecting the surfaces S4 and S5, the surface S9, and a surface connecting the surfaces S6 and S7) of the first gap C1. Accordingly, after the circuit module 100A having been peeled off from the base BL, the connection between the outer electrode B1 and the conductor film 50 with the excess conductor film 50s is prevented.

In other words, also in the circuit module 100A, the occurrence of a short circuit is suppressed between the signal electrode and the conductor film 50 provided on the outer surface of the first resin layer 40, the side surface S3, the surface S10, and the vicinity of the outer circumference of the surface S9.

<<Modification Examples of Second Embodiment of Circuit Module>>

Figure 16A:
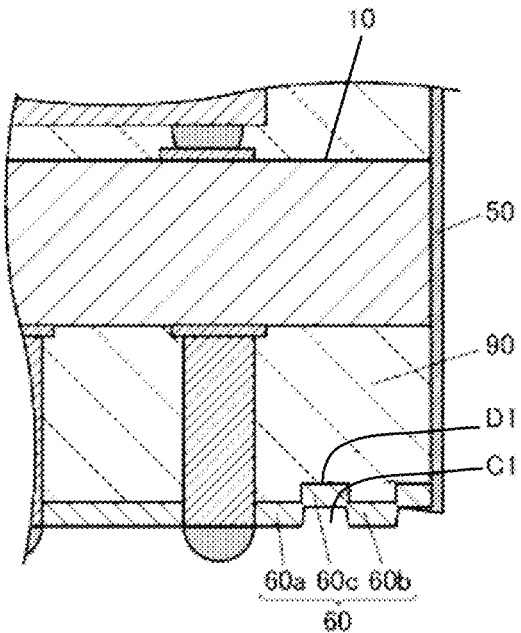
FIGS. 16A and 16B include enlarged cross-sectional views for explaining first and second modification examples of the circuit module 100A.

Various modification examples of the circuit module 100A, which is the second embodiment of the circuit module according to the present disclosure, will be described with reference to FIGS. 16A and 16B. Regarding the constituent elements of each modification example, the description of the same constituent elements as those in the circuit module 100A may be omitted or simplified.

<First and Second Modification Examples>

First and second modification examples of the circuit module 100A will be described with reference to FIGS. 16A and 16B. FIG. 16A is an enlarged cross-sectional view, equivalent to the drawing in FIG. 3, for explaining the first modification example of the circuit module 100A. This first modification example is equivalent to the eighth modification example of the circuit module 100. In the first modification example illustrated in FIG. 16A, the resin film 60 further includes a third resin film 60c having an annular shape, in addition to the first resin film 60a and the annular-shaped second resin film 60b.

The first resin film 60a and the annular-shaped second resin film 60b are connected to each other with the annular-shaped third resin film 60c. The annular-shaped third resin film 60c enters into an annular-shaped recess D1. Also, in this case, the first gap C1 exists between the outer circumference of the surface S5 and the inner circumference of the surface S7.

It is sufficient that the third resin film 60c has a thickness that makes it possible to form the first gap C1 in a state where the third resin film 60c enters into the recess D1. In other words, it is not necessary for the thickness of the third resin film 60c to be thinner than the thickness of the first resin film 60a and the thickness of the second resin film 60b.

In the first modification example, an annular-shaped recess is also provided between the annular-shaped second resin film 60b and the inner circumference of the surface S10 of the second resin layer 90, and the annular-shaped resin film enters into this recess. However, as in the second modification example of the circuit module 100A illustrated in an enlarged cross-sectional view of FIG. 16B, the annular-shaped second resin film 60b may be so disposed as to be in contact with the inner circumference of the surface S10 of the second resin layer 90. That is, the configuration described above is not essential. This second modification example is equivalent to the ninth modification example of the circuit module 100.

Figure 16B:
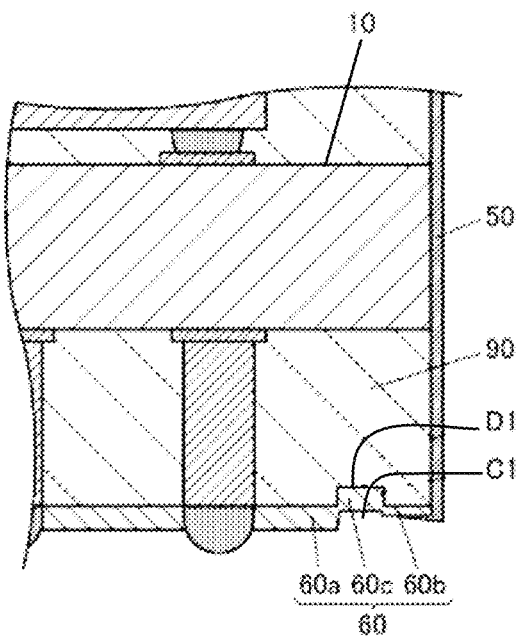

In the second modification example illustrated in FIG. 16B, the height of the surface S7 of the second resin film 60b from the surface S9 of the second resin layer 90 is lower than the height of the surface S5 of the first resin film 60a therefrom. In this case, after the formation of the conductor film 50, when the circuit module 100A is peeled off from the base BL with the adhesive layer AL being applied thereto, a situation in which the excess conductor film 50s adheres to the circuit module 100A is suppressed.

In addition to the above modification examples, modification examples equivalent to the first to seventh modification examples and the tenth modification example of the circuit module 100 may be applied to the circuit module 100A.

(Third Embodiment of Circuit Module)

The structure and features of a circuit module 100B, which is a third embodiment of a circuit module according to the present disclosure, will be described with reference to FIGS. 17 to 19. Regarding the constituent elements of the circuit module 100B, the description of the same constituent elements as those in the circuit module 100A may be omitted or simplified.

Figure 17:
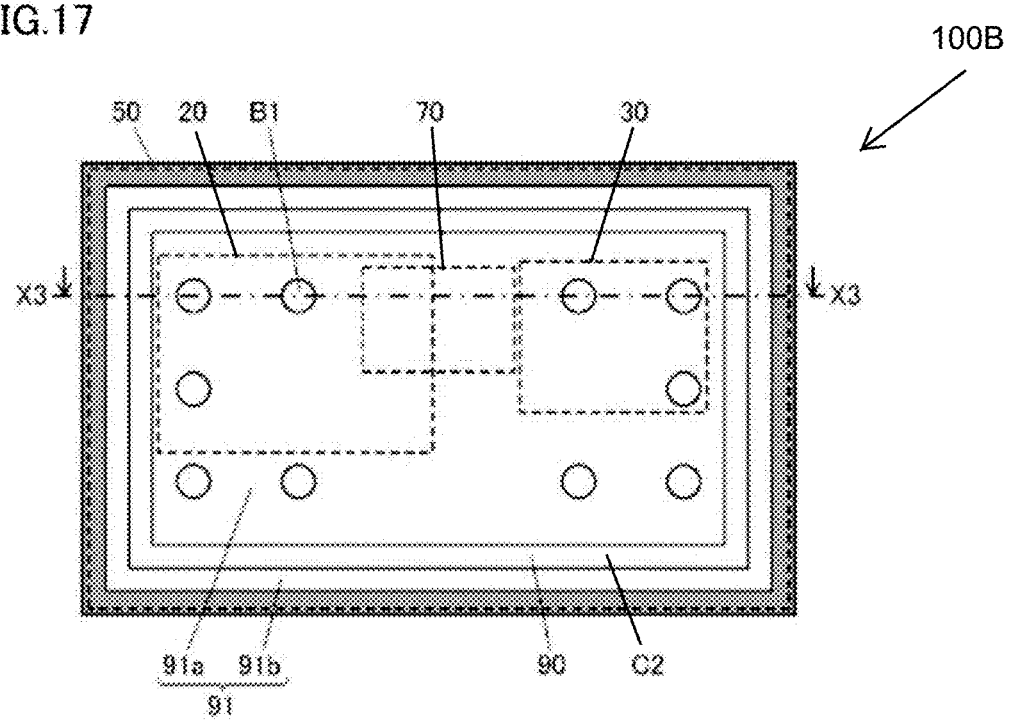
FIG. 17 is a plan view (bottom view) of a circuit module 100B, which is a third embodiment of a circuit module according to the present disclosure.
Figure 18:
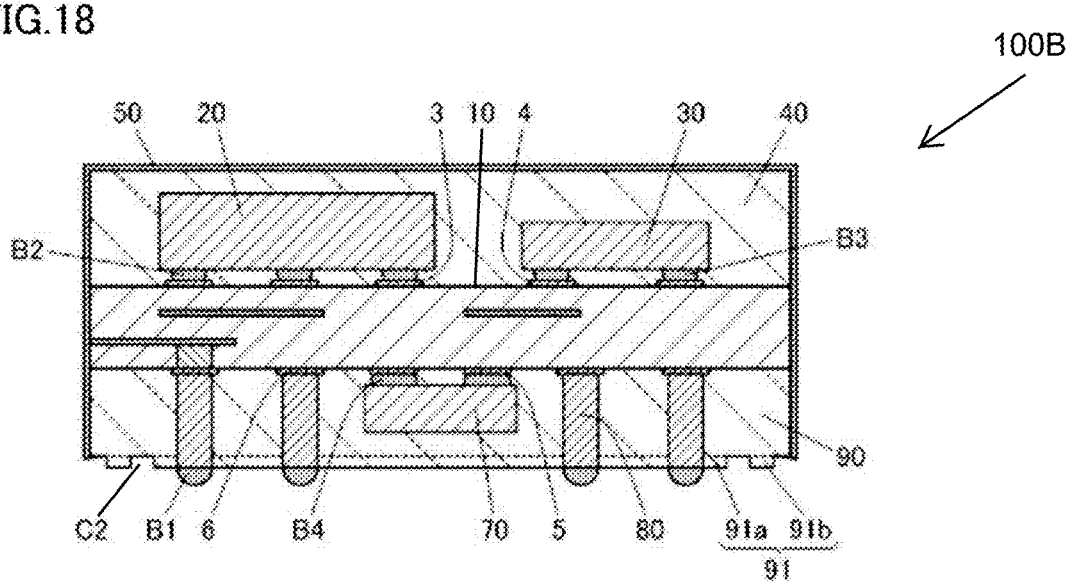
FIG. 18 is a cross-sectional view, equivalent to the drawing in FIG. 2, of the circuit module 100B, which is the third embodiment of the circuit module according to the present disclosure.

FIG. 17 is a plan view (bottom view) of the circuit module 100B. FIG. 18 is a cross-sectional view of the circuit module 100B taken by cutting along a plane including an X3-X3 line and seen from an arrow direction illustrated in FIG. 17. FIG. 19 is a cross-sectional view in which a major portion of the cross-sectional view seen from the arrow direction of the circuit module 100B illustrated in FIG. 18 is enlarged and depicted. Although FIG. 17 is not a cross-sectional view, some of the constituent members are illustrated as being shaded, in order to facilitate the understanding of the constituent members.

As in the circuit module 100A, the circuit module 100B includes a second electronic component 70, a plurality of via conductors 80, and a second resin layer 90. Since the second electronic component 70, the plurality of via conductors 80, and the second resin layer 90 are similar to those of the circuit module 100A also including the connection relationship and the sealing relationship, the descriptions thereof will be omitted. As in the circuit module 100A, a conductor film 50 is provided on the outer surface of a first resin layer 40, on a side surface S3, on a surface S10, and on the vicinity of the outer circumference of a surface S9.

On the other hand, the circuit module 100B is not provided with a resin film 60 (a first resin film 60a and a second resin film 60b). Alternatively, the second resin layer 90 is provided with a projecting portion 91 on the surface S9, which is a virtual surface. In other words, the projecting portion 91 is part of the second resin layer 90. The projecting portion 91 includes a first projecting portion 91a and a second projecting portion 91b having an annular shape. The first projecting portion 91a has a surface S11 opposing the surface S9. The second projecting portion 91b has a surface S12 opposing the surface S9.

That is, the second resin layer 90 of the circuit module 100B can be regarded as an entity in which the resin film 60 and the second resin layer 90 in the circuit module 100A are integrally molded with the same material.

A plurality of outer electrodes B1 are each disposed on the inner side relative to the outer circumference of the surface S11 of the first projecting portion 91a and to be exposed from the surface S11 in a plan view (a plan view seen from the lower side of the circuit module 100B) in the normal direction of the surface S9 of the second resin layer 90 (see FIG. 17). The annular-shaped second projecting portion 91b is disposed on the inner side relative to the outer circumference of the surface S9 of the second resin layer 90 while being spaced away from the surface S10.

Figure 19:
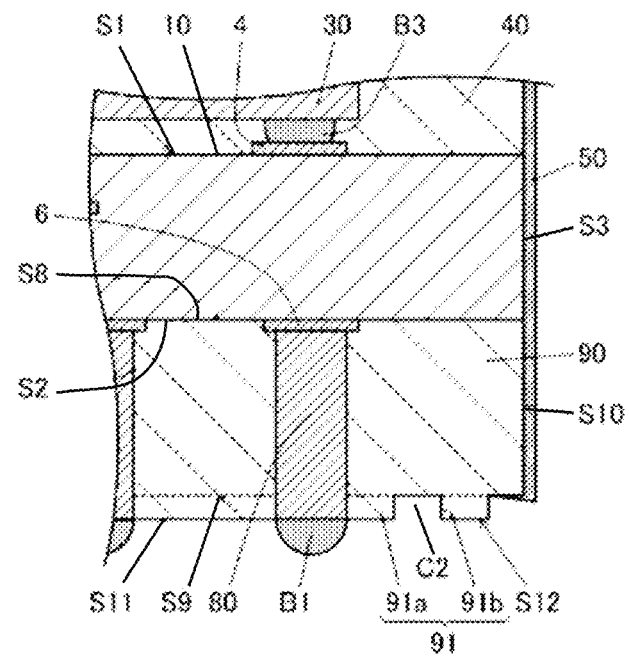
FIG. 19 is an enlarged cross-sectional view of a cross-sectional view of the circuit module 100B seen from an arrow direction illustrated in FIG. 17.

The first projecting portion 91a and the second projection portion 91b are arranged so that a second gap C2 exists between the outer circumference of the surface S11 of the first projecting portion 91a and the inner circumference of the surface S12 of the second projecting portion 91b (see FIG. 19).

Also, in the circuit module 100B, there may be a case where the second resin layer 90 is slanted with respect to the base BL in the manufacturing process. Even in such a case, the excess conductor film 50s discussed above is not applied to an inner wall (a surface connecting the surfaces S9 and S11, the surface S9, and a surface connecting the surfaces S9 and S12) of the second gap C2. Accordingly, after the circuit module 100B having been peeled off from the base BL, the connection between the outer electrode B1 and the conductor film 50 with the excess conductor film 50s is prevented.

In other words, also in the circuit module 100B, the occurrence of a short circuit is suppressed between the signal electrode and the conductor film 50 provided on the outer surface of the first resin layer 40, the side surface S3, the surface S10, and the vicinity of the outer circumference of the surface S9.

<<Modification Example of Third Embodiment of Circuit Module>>

A modification example of the circuit module 100B, which is the third embodiment of the circuit module according to the present disclosure, will be described with reference to FIG. 20. Regarding the constituent elements of each modification example, the description of the same constituent elements as those in the circuit module 100B may be omitted or simplified.

Figure 20:
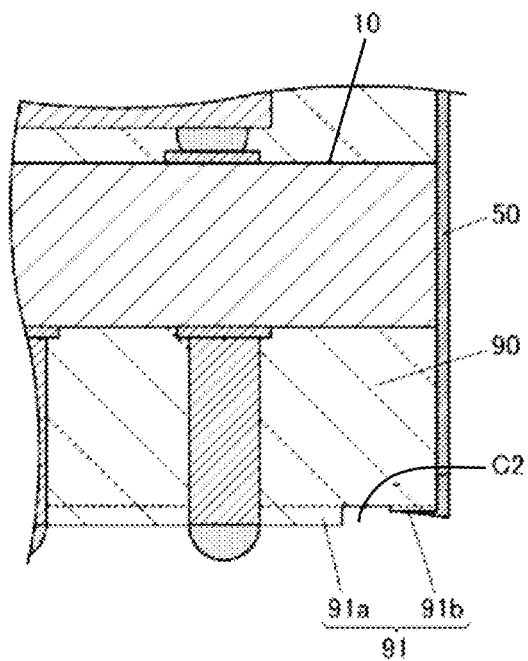
FIG. 20 is an enlarged cross-sectional view for explaining a modification example of the circuit module 100B.
Figure 21A:
FIGS. 21A, 21B, 21C, 21D, 21E and 21F include cross-sectional views for explaining part of a manufacturing process of a circuit module 200 of the Background Art.
Figure 21B:
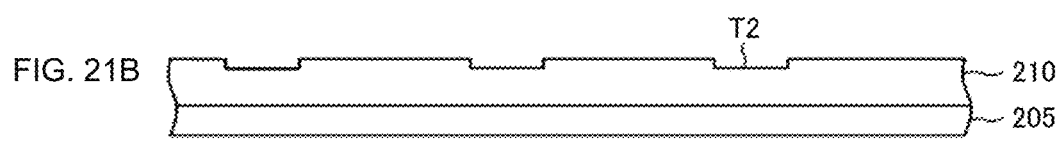
Figure 21C:
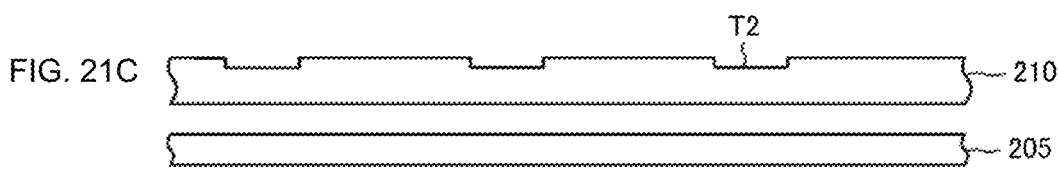
Figure 21D:
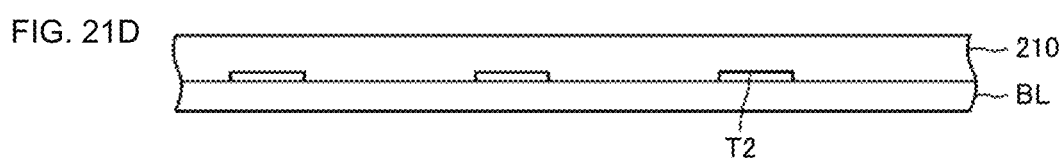
Figure 21E:
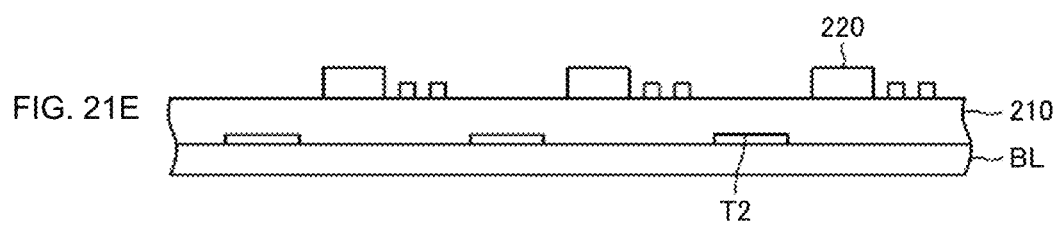
Figure 21F:
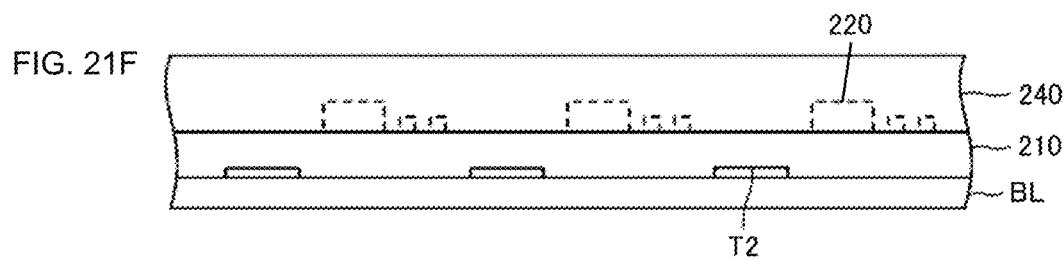
Figure 22A:
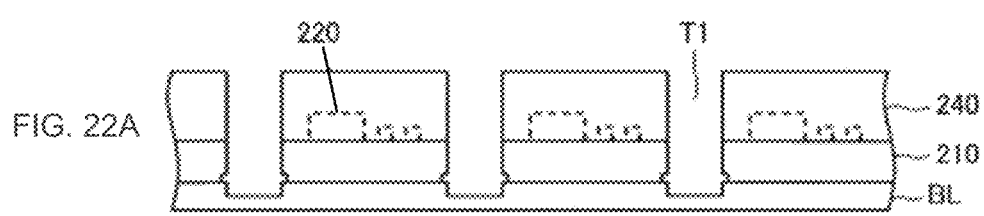
FIGS. 22A, 22B and 22C includes cross-sectional views, subsequent to FIGS. 21A, 21B, 21C, 21D, 21E and 21F, for explaining the manufacturing process of the circuit module 200 of the Background Art.
Figure 22B:
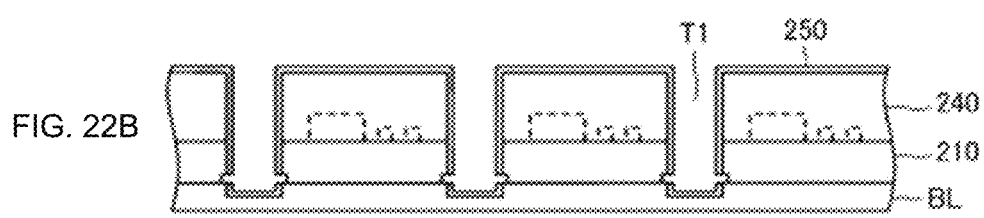
Figure 22C:
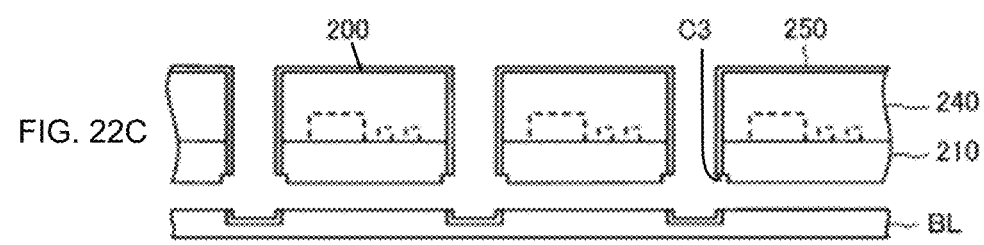

FIG. 20 is an enlarged cross-sectional view, equivalent to the drawing in FIG. 3, for explaining the modification example of the circuit module 100B. This modification example is equivalent to the fourth modification example of the circuit module 100. As in this modification example, the annular-shaped second projecting portion 91b may be so disposed as to be in contact with the inner circumference of the surface S10 of the second resin layer 90.

In the modification example illustrated in FIG. 20, the height of the surface S12 of the second projecting portion 91b from the surface S9 of the second resin layer 90 is lower than the height of the surface S11 of the first projecting portion 91a therefrom. In this case, after the formation of the conductor film 50, when the circuit module 100B is peeled off from the base BL with the adhesive layer AL being applied thereto, a situation in which the excess conductor film 50s adheres to the circuit module 100B is suppressed.

In addition to the above modification example, modification examples equivalent to the first to third modification examples, fifth and sixth modification examples, and tenth modification example of the circuit module 100 may be applied to the circuit module 100B.

It should be noted that the embodiments disclosed above are illustrative in all respects and are not restrictive. The scope of the present disclosure is defined in the appended claims, and includes equivalent meanings to the appended claims and all modifications carried out within the scope of the disclosure.

1 INSULATOR LAYER
2 INTERNAL CONDUCTOR
2a PATTERN CONDUCTOR
2b VIA CONDUCTOR
3, 4, 5 LAND
10 SUBSTRATE
20, 30 FIRST ELECTRONIC COMPONENT
40 FIRST RESIN LAYER
50 CONDUCTOR FILM
60 RESIN FILM
60a FIRST RESIN FILM
60b SECOND RESIN FILM
100 CIRCUIT MODULE
200 CIRCUIT MODULE
205 BASE MEMBER
210 SUBSTRATE
220 ELECTRONIC COMPONENT
240 RESIN LAYER
B1 OUTER ELECTRODE
B2, B3 CONNECTION MEMBER
C1 FIRST GAP
S1 ONE PRINCIPAL SURFACE
S2 THE OTHER PRINCIPAL SURFACE
S3 SIDE SURFACE
S4, S5, S6, S7, S8, S9, S10, S11, S12 SURFACE

The invention claimed is:

1. A circuit module comprising:
a substrate including a plurality of internal conductors;
a first electronic component disposed on one principal surface of the substrate;
a first resin layer provided on the one principal surface and sealing the first electronic component;
a plurality of outer electrodes provided on another principal surface of the substrate and including a ground electrode;
a conductor film at least provided on an outer surface of the first resin layer and a side surface of the substrate, and connected to the ground electrode via at least one of the plurality of internal conductors; and
a resin film,
wherein the resin film includes a first resin film provided on the other principal surface, and a second resin film having an annular shape and provided on the other principal surface in an outer side portion relative to the first resin film in a plane direction of the substrate,
the plurality of outer electrodes are each disposed to be exposed from the first resin film, and
the second resin film is spaced from the first resin film.

2. The circuit module according to claim 1,
wherein an inner circumference of the second resin film is in an inverse tapered state.

3. The circuit module according to claim 1,
wherein the resin film further includes a third resin film, and
the first resin film and the second resin film are connected to each other with the third resin film.

4. A circuit module comprising:
a substrate including a plurality of internal conductors;
a first electronic component disposed on one principal surface of the substrate;
a second electronic component disposed on another principal surface of the substrate;
a plurality of via conductors connected to the other principal surface of the substrate;
a first resin layer provided on the one principal surface and sealing the first electronic component;
a second resin layer provided on the other principal surface, and sealing the second electronic component and the plurality of via conductors;
a plurality of outer electrodes provided in the second resin layer and including a ground electrode;
a conductor film at least provided on an outer surface of the first resin layer, a side surface of the substrate and a side surface of the second resin layer, and connected to the ground electrode via at least one of the plurality of internal conductors and at least one of the plurality of via conductors; and
a resin film,
wherein the resin film includes a first resin film provided in the second resin layer, and a second resin film having an annular shape and provided in the second resin layer in an outer side portion relative to the first resin film in a plane direction of the substrate,
the plurality of outer electrodes are each disposed to be exposed from the first resin film, and
the second resin film is spaced from the first resin film.

5. A circuit module comprising:
a substrate including a plurality of internal conductors;
a first electronic component disposed on one principal surface of the substrate;
a second electronic component disposed on another principal surface of the substrate;
a plurality of via conductors connected to the other principal surface of the substrate;
a first resin layer provided on the one principal surface and sealing the first electronic component;

a second resin layer provided on the other principal surface, and sealing the second electronic component and the plurality of via conductors;

a plurality of outer electrodes provided in the second resin layer and including a ground electrode; and a conductor film at least provided on an outer surface of the first resin layer, a side surface of the substrate and a side surface of the second resin layer, and connected to the ground electrode via at least one of the plurality of internal conductors and at least one of the plurality of via conductors, wherein the plurality of outer electrodes are disposed to be exposed from the second resin layer, and a first projecting portion and a second projecting portion are provided on a surface of the second resin layer, and the second projecting portion is spaced from the first projecting portion in an outer side portion in a plane direction of the substrate.

6. The circuit module according to claim 2, wherein the resin film further includes a third resin film, and the first resin film and the second resin film are connected to each other with the third resin film.

* * * * *